United States Patent
Samata et al.

[11] Patent Number: 6,008,110
[45] Date of Patent: Dec. 28, 1999

[54] SEMICONDUCTOR SUBSTRATE AND METHOD OF MANUFACTURING SAME

[75] Inventors: Shuichi Samata; Yoshiaki Matsushita; Yoko Inoue, all of Yokohama, Japan

[73] Assignee: Kabushiki Kaisha Toshiba, Kawasaki, Japan

[21] Appl. No.: 08/799,696

[22] Filed: Feb. 11, 1997

Related U.S. Application Data

[62] Division of application No. 08/486,245, Jun. 7, 1995.

[30] Foreign Application Priority Data

Jul. 21, 1994 [JP] Japan ..................... 6-169588

[51] Int. Cl.$^6$ .................................................. H01L 21/30
[52] U.S. Cl. ........................ 438/459; 438/508; 438/495
[58] Field of Search ............................ 437/228; 438/152, 438/153, 405, 406, 458, 459, 508, 495

[56] References Cited

U.S. PATENT DOCUMENTS

| | | | |
|---|---|---|---|
| 4,851,078 | 7/1989 | Short et al. ............................. | 156/632 |
| 5,453,394 | 9/1995 | Yonehara et al. ...................... | 438/459 |
| 5,476,819 | 12/1995 | Warren .................................... | 437/228 |
| 5,565,690 | 10/1996 | Theodore et al. ....................... | 257/18 |
| 5,650,354 | 7/1997 | Himi et al. .............................. | 437/63 |
| 5,670,411 | 9/1997 | Yonehara et al. ...................... | 438/459 |

*Primary Examiner*—Charles Bowers
*Assistant Examiner*—Reneé R. Berry
*Attorney, Agent, or Firm*—Oblon, Spivak, McClelland, Maier & Neustadt, P.C.

[57] ABSTRACT

A semiconductor substrate has a support substrate formed of monocrystal silicon, an oxide film formed on the support substrate and a thin film of monocrystal silicon formed on the oxide film. The support substrate is a high-concentration P-type substrate to which boron is so doped that a resistivity of the support base is 0.1 Ω.cm or less. In manufacturing: boron is into the support base so that a resistivity of the support base is 0.1 Ω.cm or less; a silicon substrate on which the thin film of monocrystal silicon is formed is heated at 1100° C. or higher for 30 min or longer within a reducing atmosphere; the heat treated silicon substrate is attached to the high-concentration P-type support substrate via the oxide film formed on a surface of any one of the support substrate and the P-type silicon substrate and the attached substrates are heated at 950° C. or higher for 10 min or longer to bond the attached substrates together; and the bonded silicon substrate is thinned.

17 Claims, 1 Drawing Sheet

SEMICONDUCTOR SUBSTRATE AND METHOD OF MANUFACTURING SAME

This is a Division of application Ser. No. 08/486,245 filed on Jun. 7, 1995, now pending.

BACKGROUND OF THE INVENTION

The present invention relates to a semiconductor substrate and a method of manufacturing the semiconductor substrate, and more specifically to a SOI (Silicon On Insulator) substrate and a method of manufacturing the SOI substrate.

Conventionally, there have been so far known such a semiconductor substrate that a thin monocrystal silicon film is formed on a silicon substrate via an insulating film, which is referred to as a SOI substrate. The SOI substrate has various features as follows:

Where an ordinary silicon substrate (not the SOI) is used, there exists such a tendency that short channel effect as to a MOS transistor is easily produced with the advance of the microminiaturization and higher integration of a semiconductor device. As one of the methods of preventing the occurrence of the short channel effect of the MOS transistor, it is effective to increase the dopant impurity concentration at a device forming region on the substrate surface. However, in the conventional technique for introducing dopant impurities into an ordinary silicon substrate in accordance with ion implantation, where a microminiaturized device whose gate length is as small as 0.25 $\mu$m or less is required to be formed, since the dopant impurity concentration cannot be controlled sufficiently, it is difficult to control the threshold voltage of the MOS transistor. In contrast with this, in the case of the SOI substrate, since a perfect depletion can be realized at the channel portion of the MOS transistor, it is possible to easily prevent the short channel effect of the MOS transistor.

Further, in the case of the SOI substrate, since a parasitic capacitance inevitably produced at the source-drain diffusion layer can be reduced, it is possible to increase the operational speed of the MOS transistor.

In addition, when the SOI substrate is used, since there exists such a possibility that the device structure and the device manufacturing process can be both simplified, the semiconductor technique dependent upon the SOI substrate has been noticed more and more recently from this point of view.

As a first method of manufacturing the SOI substrate as described above, there exists a method as follows: two monocrystal silicon substrates are bonded to each other. In more detail, an insulating film (e.g., a silicon oxide film) is formed on one surface of one of the monocrystal silicon substrates, and the other of the monocrystal silicon substrates is bonded to this formed insulating film. Further, an outer surface (a surface not the bonded surface) of one of the two monocrystal silicon substrates is polished down to a thin film. After that, the polished surface is further dry-etched for planarization.

Further, as a second method of manufacturing the SOI substrate, there exists a method as follows: after an insulating film has been formed on a monocrystal silicon substrate, an amorphous silicon layer is further formed on the formed insulating film. Further, the formed amorphous silicon layer is once melted with a laser, for instance so that another monocrystal silicon layer can be formed by re-crystallization.

In addition, as a third method of manufacturing the SOI substrate, there exists a method called Separation by Implanted Oxygen (SIMOX) as follows: after oxygen ions have been implanted onto a monocrystal silicon substrate at a high concentration, a buried oxide film is formed by thermal oxidation to obtain both an insulating layer and a monocrystal silicon layer.

However, the SOI: substrate manufactured in accordance with the above-mentioned conventional methods as described above involve the following drawbacks:

(1) When the above-mentioned SOI substrate is used, it is preferable to add a step of gettering contaminative impurities during the process of manufacturing the device. Accordingly, various methods have been so far proposed as follows: a first method is called Intrinsic Gettering (IG) in which oxygen precipitate is formed inside a monocrystal silicon substrate to reduce the metallic contaminant at a device forming region by allowing the formed oxygen precipitate to trap metallic contaminant); and a second method is called Backside Poly Sealing (BSP) in which a poly silicon layer is formed on a reverse surface of the substrate to reduce the metallic contaminant at an element forming region by allowing the formed poly silicon layer to trap metallic contaminant.

In the above-mentioned methods, however, since the gettering step is additionally required, there exits problems in that the number of manufacturing steps increases and thereby the manufacturing cost inevitably rises.

Further, in the case of the above-mentioned IG method and the BSP method, since the gettering performance is largely dependent upon the crystal defect density (Bulk Micro Defect density) induced by oxygen in the substrate and further the film thickness and the crystal characteristics of the polysilicon film formed on the reverse surface of the substrate, there exists such a problem in that a stable gettering performance can not be always obtained.

(2) Further, in the case of the method of bonding two monocrystal silicon substrates, a thermal treatment is necessary to bond two monocrystal silicon substrates to each other. In this heat treatment process, however, since crystal defect (such as oxygen precipitate) is often formed on the surface of the substrate, defective devices are often manufactured. Further, in the case of the method of bonding two monocrystal silicon substrates to each other, If the oxygen concentration in the thin monocrystal silicon layer is high, since thermal donors are produced from the oxygen in the thin monocrystal silicon layer during the bonding process of the two monocrystal silicon substrates, the defective devices are manufactured due to fluctuations in resistivity or due to crystal defect.

On the other hand, in order to eliminate the drawbacks as described above, it may be considered to previously heat-treat the monocrystal silicon substrate (on which the device is formed) under non-oxidation condition prior to the bonding process. When the non-oxidation heat treatment is effected, although the crystal defect can be eliminated almost perfectly, however, since the dopent impurities are also diffused outward due to the non-oxidation heat treatment, there arises another problem in that the dopant impurity concentration in the thin monocrystal silicon film is reduced.

(3) On the other hand, even in the case of the methods of forming a monocrystal silicon layer on the basis of the re-crystallization after malting with a laser and the SIMOX method, since it Is difficult to eliminate the defect in the thin monocrystal silicon layer, the practical SOI substrate cannot be so far obtained.

SUMMARY OF THE INVENTION

With these problems in mind, therefore, it is the object of the present invention to provide a semiconductor substrate which is high in quality, excellent in the gettering performance, and free from the thermal donors and crystal defect.

Further, another object of the present invention is to provide a method of manufacturing the semiconductor substrate without adding any complicated steps and without reducing the dopant impurities concentration.

To achieve the above-mentioned object, the present invention provides a semiconductor substrate comprising: a support substrate formed of monocrystal silicon; an oxide film formed on the support substrate; and a thin film of monocrystal silicon formed on the oxide film, wherein the support substrate is a high-concentration P-type substrate to which boron is so doped that a resistivity of the support base is 0.1 Ω.cm or less.

It is preferable that oxygen concentration of the thin film is $5 \times 10^{17} cm^{-3}$ or less.

To achieve the above-mentioned object, the present invention provides a method of manufacturing a semiconductor substrate having a support substrate formed of boron-doped high-concentration P-type monocrystal silicon, an oxide film formed on the support substrate, and a thin film of monocrystal silicon formed on the oxide film, comprising: doping boron into the support base so that a resistivity of the support base is 0.1 Ω.cm or less; heat treating a silicon substrate on which the thin film of monocrystal silicon is formed at 1100° C. or higher for 30 min or longer within a reducing atmosphere; attaching the heat treated silicon substrate to the high-concentration P-type support substrate via the oxide film formed on a surface of any one of the support substrate and the P-type silicon substrate and heat treating the attached substrates at 950° C. or higher for 10 min or longer to bond the attached substrates together; and thinning the bonded silicon substrate.

It is preferable that the oxide film with a thickness from 10 nm or more to 5 μm or less is formed on the support substrate or the silicon substrate.

DETAILED DESCRIPTION OF THE PREFERRED EMBODIMENTS

Figure 1:
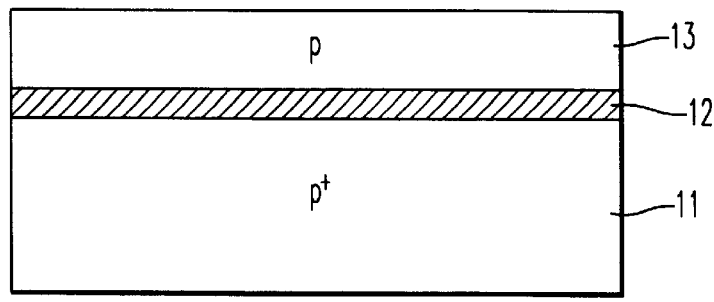
FIG. 1 is a cross sectional view showing the structure of a semiconductor substrate for comparison between the present invention and prior art.

The embodiments of the semiconductor substrate according to the present invention will be described hereinbelow.

First, a semiconductor substrate according to the present invention and a prior art semiconductor substrate were both manufactured. The layer structure of each of these semiconductor substrates was formed by a monocrystal silicon support substrate 11, an oxide film 12 formed on the support substrate 11, and a thin monocrystal silicon film 13 formed on the oxide film 12.

In a first embodiment of the semiconductor substrate according to the present invention, a P⁺-type (boron-doped) monocrystal silicon substrate with a resistivity of $\rho_{sub}$=0.05 Ω.cm was used as the support substrate 11; a thermal oxide film $SiO_2$ with a film thickness of 1 μm was used as the oxide film 12; and a P-type (boron-doped) monocrystal silicon with a film thickness of 0.1 μm, a resistivity of ρ=10 Ω.cm, and an oxygen concentration of $[Oi]=13.5 \times 10^{17} cm^{-3}$ was used as the thin monocrystal silicon film 13.

The first embodiment of the semiconductor substrate as described above was manufactured as follows:

First, the support substrate 11 was thermal-oxidized to form the oxide film 12. The support substrate 11 was bonded with a silicon substrate (on which the thin monocrystal silicon film 13 was to be formed), and further heat-treated at 1000° C. for 30 min within a nitrogen atmosphere to bond the two substrates.

Further, the reverse surface (not the bonded surface) of the silicon substrate (on which the thin monocrystal silicon film 13 was to be formed) was polished, and then the surface thereof was planarized by dry etching. After that, the surface thereof was further planarized through a touch mirror processing to form the thin monocrystal silicon film 13. As a result, the first embodiment of the semiconductor substrate according to the present invention was obtained.

Further, as the crystal growing method of the monocrystal silicon substrates of the two sorts, the CZ (Czochralski) method was adopted for both.

In a second embodiment of the semiconductor substrate according to the present invention, a P⁺-type (boron-doped) monocrystal silicon substrate with a resistivity of $\rho_{sub}$=0.05 Ω.cm was used as the support substrate 11; a thermal oxide film $SiO_2$ with a film thickness of 1 μm was used as the oxide film 12; and a P-type (boron-doped) monocrystal silicon with a film thickness of 0.1 μm, a resistivity of $\tau_{sub}$=10 Ω.cm, and an oxygen concentration of $[Oi]=3 \times 10^{17} cm^{-3}$ (different from that of the first embodiment) was used as the thin monocrystal silicon film 13. Here, the second embodiment of the semiconductor substrate as described above was manufactured in the same way as with the case of the first embodiment. Further, as the crystal growing method of the monocrystal silicon substrates of the two sorts, the CZ (Czochralski) method or the MCZ (magnetic Czochralski) method was adopted for both.

In a third embodiment of the semiconductor substrate according to the present invention, a P⁺-type (boron-doped) monocrystal silicon substrate with a resistivity of $\rho_{sub}$=0.05 Ω.cm was used as the support substrate 11; a thermal oxide film $SiO_2$ with a film thickness of 50 nm (different from that of the first and second embodiments) was used as the oxide film 12; and a P-type (boron-doped) monocrystal silicon with a film thickness of 0.1 μm, a resistivity of τ=10 Ω.cm, and an oxygen concentration of $[Oi]=13.5 \times 10^{17} cm^{-3}$ was used as the thin monocrystal silicon film 13. The reason why the film thickness of the oxide film 12 was formed smaller as compared with the case of the first and second embodiments was to confirm that even if the oxide film thickness was reduced, sufficient electric insulating characteristics could be obtained in practice, as far as the film thickness lay within a predetermined range (from 10 nm to 5 μm).

The third embodiment of the semiconductor substrate as described above was manufactured as follows:

First, the support substrate 11 was thermal-oxidized to form the oxide film 12. A silicon substrate (on which the thin monocrystal silicon film 13 was to be formed) was heat-treated at 1200° C. for 60 min within a hydrogen atmosphere $H_2$ (non-oxidation heat-treatment for crystal defect elimination).

After that, the support substrate 11 was attached to the silicon substrate (on which the thin monocrystal silicon film 13 was to be formed), and further heat-treated at 1000° C. for 30 min within a nitrogen atmosphere to bond the two substrates.

Lastly, the reverse surface (not the bonded surface) of the silicon substrate (on which the thin monocrystal silicon film 13 was to be formed) was polished, and then the surface thereof was planarized by dry etching. After that, the surface thereof was further planarized through the touch mirror processing to form the thin monocrystal silicon film 13. As a result, the third embodiment of the semiconductor substrate was obtained.

Further, as the crystal growing method of the monocrystal silicon substrates of the two sorts, the CZ (Czochralski) method was adopted for both.

As a first prior art semiconductor substrate, a P-type (boron-doped) monocrystal silicon substrate with a resistivity of $\rho_{sub}$=10 Ω.cm (different from that of the above-mentioned embodiments) was used as the support substrate 11; a thermal oxide film $SiO_2$ with a film thickness of 1 μm, was used as the oxide film 12; and a P-type (boron-doped) monocrystal silicon with a film thickness of 0.1 μm, a resistivity of ρ=10 Ω.cm, and an oxygen concentration of [Oi]=13.5 ×10$^{17}$ cm$^{-3}$ was used as the thin monocrystal silicon film 13.

The first prior art semiconductor substrate as described above was manufactured in the same way as with the case of the first embodiment. Further, as the crystal growing method of the monocrystal silicon substrates of the two sorts, the CZ (Czochralski) method was adopted for both.

As a second prior art semiconductor substrate, a P-type (boron-doped) monocrystal silicon substrate with a resistivity of $\rho_{sub}$=10 Ω.cm (different from that of the embodiments) was used as the support substrate 11; a thermal oxide film $SiO_2$ with a film thickness of 50 nm (different from that of the first prior art) was used as the oxide film 12; and a P-type (boron-doped) monocrystal silicon with a film thickness of 0.1 μm, a resistivity of ρ=10 Ω.cm, and an oxygen concentration of [Oi]=13.5×10$^{17}$ cm$^{-3}$ was used as the thin monocrystal silicon film 13.

Further, as the crystal growing method of the monocrystal silicon substrates of the two sorts, the CZ (Czochralski) method was adopted for both.

The second prior art semiconductor substrate as described above was manufactured as follows:

First, the support substrate 11 was thermal-oxidized to form the oxide film 12. The silicon substrate (on which the thin monocrystal silicon film 13 was to be formed) was heat-treated at 1200° C. for 60 min within a hydrogen atmosphere $H_2$ (non-oxidation heat-treatment for crystal defect elimination)

After that, the support substrate 11 was attached to the silicon substrate (on which the thin monocrystal silicon film 13 was to be formed), and further heat-treated at 1000° C. for 30 min within a nitrogen atmosphere to bond the two substrates.

Lastly, the reverse surface (not the bonded surface) of the silicon substrate (on which the thin monocrystal silicon film 13 was to be formed) was polished, and then the surface thereof was planarized by dry etching. After that, the surface thereof was further planarized through the touch mirror processing to form the thin monocrystal silicon film 13. As a result, the second prior art semiconductor substrate was obtained.

The evaluation results of the first, second and third embodiment semiconductor substrates and the first and second prior art semiconductor substrates manufactured as described above will be explained hereinbelow.

First, the comparison results of the first and second embodiment substrates with the first prior art semiconductor substrate will be explained. As already explained, the first embodiment substrate is different from the first prior art substrate in that the resistivity $\rho_{sub}$ of high-concentration boron-doped support substrate 11 is reduced in the first and second embodiments (the embodiment: $\rho_{sub}$=0.05 Ω.cm; the prior art: $\rho_{sub}$=10 Ω.cm). Further, the second embodiment substrate is different from the first prior art substrate in that the resistivity $\rho_{sub}$ of high-concentration boron-doped support substrate 11 is reduced in the second embodiment (the embodiment: $\rho_{sub}$=0.05 Ω.cm; the prior art: $\rho_{sub}$=10 Ω.cm) and further in that the oxygen concentration of the thin film 13 is reduced in the second embodiment (the embodiment: [Oi]=3×10$^{17}$ cm$^{-3}$; the prior art: [Oi]=13.5×10$^{17}$ cm$^{-3}$).

Figure 2:
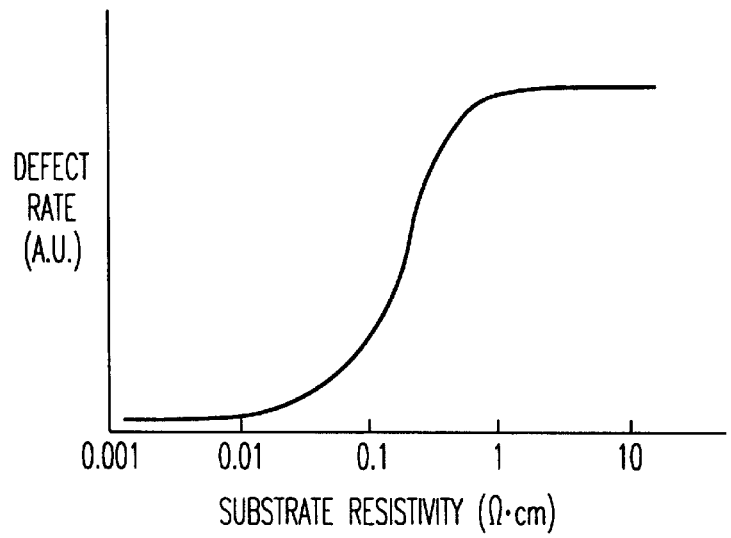
FIG. 2 is a graphical representation showing the relationship between the resistivity and the defect rate of a probe test of 64-M DRAMS according to the present invention.

By using the semiconductor substrates of the first and second embodiments and of the first prior art, 64-M DRAM (Dynamic Random Access Memory) were manufactured for probe testing these 64-M DRAMS. As the test results, the production yield of the semiconductor substrates of the first embodiment is five percent higher than that of the first prior art. The test results of the Inventors are shown in FIG. 2, which indicates the relationship between the resistivity (which depends upon boron doping rate) and the defect rate (an inverse number of the yield) of the high-concentration boron-doped P-type monocrystal silicon support substrate 11.

Further, with respect to the first and second embodiment substrates and the first prior art substrate, the defect category and the crystal defect on the substrate surface were evaluated. In the case of the first prior art substrate, crystal defect such as OSF (Oxidation induced Stacking Fault) was seen on a part of the substrate surface. In addition, PN junction leakage defect was also confirmed. In the case of the first and second embodiment substrates, on the other hand, no crystal defect was seen on each of the substrate surfaces. In addition, the PN junction leakage defect was not also confirmed. This may be due to the fact that in the case of the first and second embodiment substrates, since the support substrate each containing high-concentration boron was used, contaminant produced during the device manufacturing process could be removed due to the gettering effect of boron, with the result that it is possible to prevent the occurrence of the crystal defect caused by the contamination during the manufacturing process.

With respect to the gettering effect, a P-type (boron-doped) monocrystal silicon substrate with a resistivity of $\rho_{sub}$=1 to 10 Ω.cm, like the first prior art substrate, has been used as the support substrate. Because it has been believed that a thick oxide film embedded in a SOI substrate would prevent impurities on the surface of the SOI substrate from dispersing into the support substrate, even a high-concentration boron-doped silicon substrate is used, hence resulting in less gettering performance. Contrary to this, as described with respect to the first embodiment substrate, according to the present invention, high gettering performance could be observed due to the employment of the P-type (high-concentration boron-doped) monocrystal silicon substrate with the resistivity of $\rho_{sub}$=0.05 Ω.cm. The present invention is accomplished under the advance of the microminiaturization and higher integration of semiconductor devices that are easily affected by gettering.

Further, in the case of the first embodiment substrate, the probe yield was slightly reduced, as compared with that of the second embodiment substrate. This is because in the case of the first embodiment, thermal donors were produced due to the influence of oxygen solidified in the thin silicon film, so that the threshold value fluctuated slightly. In addition, the crystal defect probably caused by the thermal donors was also found, and thereby this also caused the yield to be reduced.

Further, with respect to the first and second embodiment substrates and the first prior art substrate, each of these substrates was contaminated forcibly by use of Fe of $10^{12}$ atoms/cm$^2$. After each substrate was heat treated appropriately, Fe distribution from the substrate surface in the depth direction was evaluated, respectively. As a result, in the case of the first prior art substrate, Fe segregation was found at an interface between the support substrate 11 and the oxide film 12 and another interface between the oxide film 12 and the thin film 13. In addition, Fe was detected in the support substrate 11 or in the thin film 13. Further, the OSF (Oxidation induced Stacking Fault) was generated at a part of the substrate surface. In the first and second embodiment substrates, on the other hand, although a great amount of Fe was detected in the support substrate 11, Fe was not detected in the thin film 13 (below a detectable limit). Further, no OSF was found on the substrate surface. This may be due to the fact that in the case of the first and second embodiment substrates, Fe was removed due to the gettering effect by high-concentration boron, with the result that it is possible to prevent the occurrence of crystal defect in the thin film 13.

The comparison results between the third embodiment substrate and the second prior art substrate will be explained. As already explained, the third embodiment substrate is different from the second prior art substrate in that the resistivity $\rho_{sub}$ of high-concentration boron-doped support substrate 11 is reduced in the third embodiment (the embodiment: $\rho_{sub}$=0.05 Ω.cm; the prior art: $\rho_{sub}$=10 Ω.cm). In addition, the third embodiment substrate is different from the first and second embodiment substrates in the heat treatment conditions during the manufacturing process (the non-oxidation heat treatment at 1200° C. for 60 min).

Further, by using the third embodiment substrate and the second prior art substrate, 64-M DRAM (Dynamic Random Access Memory) were manufactured for probe testing these 64-M DRAMs. As the test results, the production yield of the third embodiment substrate was higher by 10% than that of the first prior substrate.

Further, the defect category was checked. In the case of the second prior art substrates, the threshold value $V_{TH}$ deviated largely from a design value and also the distribution (dispersion) width thereof was also large. In the case of the third embodiment substrates, however, the threshold value $V_{TH}$ roughly matched a design value and also the distribution width thereof was small, as shown in FIG. 3.

To examine the reason of the above, the resistivities of the thin films 13 of the third embodiment substrate and the second prior art substrate were measured, respectively. The measured results indicated that in the case of the third embodiment substrate, the resistivity of the thin film 13 was roughly equal to that of the silicon substrate measured before the thin film 13 was formed. On the other hand, in the case of the second prior art substrate, the resistivity of the thin film 13 was three times or more higher than that of the silicon substrate measured before the thin film 13 was formed. In addition, the distribution width of the resistivity was large. In other words: in the second prior art substrate, the dopant impurities are diffused outward due to the high-temperature non-oxidation heat treatment, so that the resistivity increases and thereby the threshold voltage $V_{TH}$ also increases. In contrast with this, in the third embodiment substrate, although the dopant impurities are diffused outward, since dopant impurities are supplied from the support substrate 11 to the thin film 13 by the heat treatment in the bonding process effected thereafter, the resistivity is not increased, so that the threshold voltage $V_{TH}$ does not change. Here, the reason why the dopant impurities are diffused from the support substrate 11 to the thin film 13 in the third embodiment substrate is that the dopant concentration of the support substrate 11 Is high and further the second heat treatment is effected.

Figure 3:
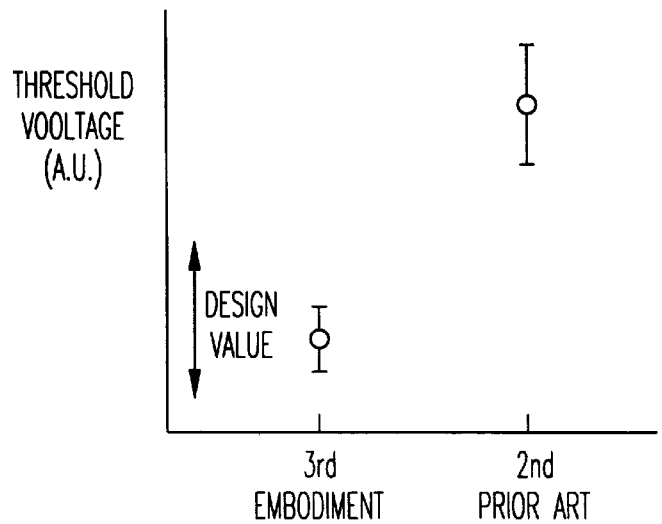
FIG. 3 is a graphical representation showing the dispersion due to manufacturing of the threshold voltage of various substrates in comparison between the present invention and prior art.

Further, as shown in FIG. 3, in the case of the second prior art substrate, the distribution of the threshold value is large. Once the threshold value disperses, it is difficult to correct the distribution width during the manufacturing process by ion implantation, for instance. In contrast with this, in the case of the third embodiment substrate, it is possible to reduce the distribution width of the threshold voltage, as shown in FIG. 3.

Further, with respect to the third embodiment substrate and the second prior art substrate, the defect category and the crystal defect on the substrate surface were evaluated. In the case of the second prior art substrate, crystal defect was seen on the surface of a part of the substrates. In addition, PN junction leakage defect was also confirmed. In the case of the third embodiment substrate, on the other hand, crystal defect was not seen on the surface of the substrates. In addition, the PN junction leakage defect was not also confirmed. This may be due to the fact that in the case of the third embodiment substrate, since the support substrate each containing high concentration boron is used in the same way as with the case of the first and second embodiments, contaminant produced during the device manufacturing process can be removed due to the gettering effect by boron, with the result that it is possible to prevent the occurrence of the crystal defect caused by the contamination during the manufacturing process. As described above, in the third embodiment substrate, since the resistivity $\rho_{sub}$ of the support substrate 11 is reduced by doping high-concentration boron ($\rho_{sub}$=0.05 Ω.cm) in the same way as with the case of the first and second embodiment substrates, it is possible to obtain the effect of the first embodiment in addition to the effect of the second embodiment.

The comparison results between the first and second embodiments and the third embodiment will be explained hereinbelow.

With respect to the probe test, the yield of the third embodiment is 5% higher than that of the first and second embodiment substrates. Further, with respect to the fault category, the PN junction leakage defect and the gate oxide film defect of the third embodiment substrate can be further reduced, as compared with those of the first and second embodiment substrates. This is because since the third embodiment substrate is processed through the high-temperature non-oxidation heat treatment, the crystal defect and the thermal donors in the thin film 13 can be eliminated roughly perfectly, with the result that it is possible to reduce the PN junction leakage due to the crystal defect such as OSF, the gate oxide film defect due to the crystal defect such as BMD, or the threshold voltage deviation due to the thermal donors.

As described above, in the first, second and third embodiment substrates according to the present invention, it is possible to provide the semiconductor substrate excellent in gettering performance and free from the thermal donors and crystal defect. In addition, it is possible to manufacture the semiconductor substrate as described above without reducing the dopant impurity concentration.

Further, since the gettering performance can be improved without adding the complicated gettering process to the conventional manufacturing process, an increase in the manufacturing cost can be suppressed.

Further, since the high concentration P-type substrate is used, it is unnecessary to add the heat treatment process as required when the IG substrate is used or the CVD process as required when the BSP substrate is used, so that the process of manufacturing semiconductor substrates can be further simplified.

Further, in the respective embodiments as described above, although the resistivity of the support substrate is determined to be $\rho_{sub}$=0.05 $\Omega$.cm, it is possible to obtain the same effect as with the case of the first embodiment, as far as $\rho_{sub}$ is 0.1 $\Omega$.cm or less, on the basis of the measurement results of the defect ratio in the probe test as shown in FIG. 2.

Further, in the second embodiment, although the oxygen concentration of the thin film 13 is determined to be [Oi]= $3 \times 10^{17}$ cm$^{-3}$, the inventors' test results indicate that it is possible to prevent the occurrence of thermal donors as far as the oxygen concentration is suppress less than [Oi]=5× $10^{17}$ cm$^{-3}$. Further, in order to obtain the thin film 13 whose oxygen concentration is less than [Oi]=5×$10^{17}$ cm$^{-3}$, the monocrystal silicon substrate whose oxygen concentration is less than [Oi]=5×$10^{17}$ cm$^{-3}$ is used, or the monocrystal silicon substrate is heat treated at a high temperature within a reducing atmosphere.

Further, as the oxide film 12 (the insulating film of the SOI substrate), it is desirable to use $SiO_2$ film. Further, the film thickness is preferably 10 nm or more but 5 $\mu$m or less. If the film thickness is less than 10 nm, electrical insulating defect occurs, and if more than 5 $\mu$m, the semiconductor substrate is warped (bent) excessively out of practical use.

On the other hand, it is desirable to determine the thickness of the thin film 13 between 10 nm or more and 10 $\mu$m, or less. If less than 10 nm, the thin silicon film disappears due to oxidation or oxide film etching effected during the device manufacturing process, and if more than 10 $\mu$m, boron supplied from the support substrate 11 cannot diffuse to the surface of the thin film 13.

Further, in the third embodiment substrate, the high-temperature non-oxidation heat treatment (the first heat treatment for crystal defect elimination) is determined as at 1200° C. for 60 min. However, this heat treatment must be at least 1100° C. or higher and 30 min or longer. If the above-mentioned heat treatment conditions are not satisfied, oxygen cannot be sufficiently diffused outward, so that it is impossible to prevent the occurrence of the crystal defect and the thermal donors. Further, in the third embodiment, although the high-temperature non-oxidation heat treatment is effected within the hydrogen $H_2$ atmosphere, another gas such as CO, $CO_2$, Ar, He, Ne, Kr, Xe, etc. and a mixture gas of these can be also used.

In the third embodiment substrate, the heat treatment (the second heat treatment for substrate bonding) is determined as at 1000° C. for 30 min. However, as far as the conditions are at least 950° C. or higher and 10 min or longer, it is possible to obtain the effect of the present invention when the resistivity of the thin film 13 ranges between 0.1 and 100 $\Omega$.cm. In this case, however, it is necessary to change the resistivity of the support substrate 11, the film thickness of the oxide film 12, and the temperature and the time of the heat treatment, according to the resistivity of the thin film 13.

Further, in the third embodiment, the second heat treatment for substrate bonding and for supplying the dopant impurities from the support substrate 11 to the thin film 13 can be divided into two steps. However, it is preferable to effect both the heat treatments at the same time successively as the same process, from the standpoint of manufacturing simplification.

Further, in the first to third embodiments, although the thin film 13 is formed by use of the P-type substrate grown in accordance with the CZ method, without being limited only thereto, it is of course possible to use the N-type or I-type substrate grown in accordance with FZ (Floating zone) method, MCZ (Magnetic Czochralski) method, CCZ (Continuous Czochralski) method, DLCZ (Double Layered Czochralski) method, etc.

Further, in the first to third embodiments, although the resistivity of the thin monocrystal silicon film 13 is determined to be 10 $\Omega$.cm, the similar effect of the present invention can be also obtained in a range from 0.1 to 100 $\Omega$.cm.

Further, in the first to third embodiments, although the oxide film 12 is formed on the substrate for the support substrate 11, the oxide film 12 can be formed on the substrate either for the thin film 13 or the support substrate 11 or on the both substrates.

As described above, in the semiconductor substrate according to the present invention, it is possible to provide the semiconductor device excellent in gettering performance and free from the thermal donors and crystal defect, and further to provide the method of manufacturing a semiconductor substrate without adding any complicated process and without reducing the dopant impurity concentration.

Further, according to the semiconductor substrate of the present invention, it is possible to manufacture DRAMs which can reduce the PN junction leakage defect and the threshold voltage dispersion.

What is claimed is:

1. A method of manufacturing a semiconductor substrate having a support substrate formed of boron-doped high-concentration P-type monocrystal silicon, an oxide film formed on the support substrate, and a thin film of monocrystal silicon formed on the oxide film, comprising:

doping boron into the support base so that a resistivity of the support base is 0.1 $\Omega$.cm or less;

heat treating a silicon substrate on which the thin film of monocrystal silicon is formed at 1100° C. or higher for 30 min or longer within a reducing atmosphere;

attaching the heat treated silicon substrate to the high-concentration P-type support substrate via the oxide film formed on a surface of any one of the support substrate and the P-type silicon substrate and heat treating the attached substrates at 950° C. or higher for 10 min or longer to bond the attached substrates together; and thinning the bonded silicon substrate, wherein said reducing atmosphere comprises at least one member selected from the group consisting of $H_2$, CO, $CO_2$, Ar, He, Ne, Kr and Xe.

2. The method of manufacturing a semiconductor substrate of claim 1, which further comprises the step of forming the oxide film with a thickness from 10 nm or more to 5 μm or less on the support substrate or the silicon substrate.

3. The method of manufacturing a semiconductor substrate of claim 1, wherein said heat treating of the silicon substrate is carried out so that the thin film has an oxygen concentration of $5 \times 10^{17}$ cm$^{-3}$ or less.

4. The method of claim 1, wherein said oxide film has a thickness of 50 nm to 1 μm.

5. The method of claim 1, wherein said reducing atmosphere comprises $H_2$.

6. The method of claim 1, wherein said heat treating of the attached substrates is carried out in an atmosphere comprising $N_2$.

7. The method of claim 1, wherein said silicon thin film has a thickness of 10 nm–10 μm.

8. The method of claim 1, wherein said thin film has a resistivity of 0.1–100 Ωcm.

9. A method for manufacturing a semiconductor substrate, comprising:

heat treating a silicon substrate at 1100° C. or higher for 30 minutes or longer in a reducing atmosphere;

attaching said heat treated silicon substrate to a boron doped silicon support base having a resistivity of 0.1 Ωcm or less, via an oxide film on a surface of said support base or said silicon substrate, and heat treating the attached support silicon substrate at 950° C. or higher for ten minutes or longer; and thinning the attached silicon substrate, wherein said reducing atmosphere comprises at least one member selected from the group consisting of $H_2$, CO, $CO_2$, Ar, He, Ne, Kr and Xe.

10. The method of claim 9, further comprising the step of forming said oxide film having a thickness of 50 nm to 1 μm on said support base or said silicon substrate.

11. The method of claim 9, wherein said thinned attached silicon substrate has an oxygen concentration of $5 \times 10^{17}$ cm$^{-3}$ or less.

12. The method of claim 9, wherein said oxide film has a thickness of 50 nm to 1 μm.

13. The method of claim 9, wherein said reducing atmosphere comprises $H_2$.

14. The method of claim 9, wherein said heat treating of said attached support and silicon substrate is carried out in an atmosphere comprising $N_2$.

15. The method of claim 9, wherein said thinning is carried out until the attached silicon substrate has a thickness of 10 nm to 10 μm.

16. The method of claim 9, wherein said thinned attached silicon substrate has a resistivity of 0.1–100 Ωcm.

17. The method of claim 9, wherein said semiconductor substrate produced by said method comprises a support base of boron-doped monocrystalline silicon, an oxide film on said support base, and a film of monocrystalline silicon on said oxide film.

* * * * *